(12) United States Patent
Chen et al.

(10) Patent No.: US 11,134,583 B2
(45) Date of Patent: *Sep. 28, 2021

(54) SLIDE RAIL MECHANISM AND SUPPORTING ASSEMBLY THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 171 days.

This patent is subject to a terminal disclaimer.

(21) Appl. No.: 16/409,914

(22) Filed: May 13, 2019

(65) Prior Publication Data
US 2020/0275576 A1 Aug. 27, 2020

(30) Foreign Application Priority Data

Feb. 25, 2019 (TW) .................................. 108106608

(51) Int. Cl.
*H05K 7/18* (2006.01)
*A47B 88/49* (2017.01)
*A47B 88/407* (2017.01)

(52) U.S. Cl.
CPC .......... *H05K 7/183* (2013.01); *A47B 88/407* (2017.01); *A47B 88/49* (2017.01)

(58) Field of Classification Search
CPC ........ H05K 7/183; A47B 88/49; A47B 88/407
USPC ............ 248/220.41, 220.22, 221.11, 223.31, 248/223.41, 224.8, 225.11, 241; 361/727, 361/756, 826; 312/334.1, 334.4, 334.5, 312/223.6

See application file for complete search history.

(56) References Cited

U.S. PATENT DOCUMENTS

| | | |
|---|---|---|
| 6,972,949 B1 | 12/2005 | Heigenber |
| 7,472,795 B2 | 1/2009 | Dubon et al. |
| 7,554,819 B2 | 6/2009 | Chen et al. |
| 7,712,615 B2 | 5/2010 | Chen et al. |
| 7,921,228 B2 * | 4/2011 | Lu ...................... H05K 7/1489 710/2 |

(Continued)

*Primary Examiner* — Eret C McNichols
*Assistant Examiner* — Michael McDuffie
(74) *Attorney, Agent, or Firm* — Alan D. Kamrath; Karin L. Williams; Mayer & Williams PC

(57) ABSTRACT

A slide rail mechanism includes a first slide rail assembly, a second slide rail assembly and a supporting assembly. Each of the slide rail assemblies includes a first rail, a second rail and a third rail movably mounted between the first rail and the second rail. The second rail is longitudinally movable relative to the first rail. The second rail of the first slide rail assembly and the second rail of the second slide rail assembly are respectively arranged with a first mounting device and a second mounting device. The supporting assembly includes a supporting member, and a first connecting device and a second connecting device arranged on the supporting member. The first connecting device and the second connecting device are respectively connected to the first mounting device and the second mounting device.

19 Claims, 11 Drawing Sheets

(56) References Cited

U.S. PATENT DOCUMENTS

| | | | |
|---|---|---|---|
| 8,251,321 B2 * | 8/2012 | Chen | H05K 7/1491 |
| | | | 248/70 |
| 8,602,372 B2 * | 12/2013 | Yu | H05K 7/1489 |
| | | | 248/224.8 |
| 8,872,030 B2 * | 10/2014 | McNeal | H04Q 1/02 |
| | | | 174/101 |
| 9,144,174 B2 * | 9/2015 | Chen | H05K 7/1421 |
| 9,281,676 B2 | 3/2016 | Chen et al. | |
| 9,383,038 B2 | 7/2016 | Chen et al. | |
| 9,668,372 B2 | 5/2017 | Chen et al. | |
| 9,867,311 B2 * | 1/2018 | Chen | F16L 3/015 |
| 9,913,398 B1 * | 3/2018 | Chen | H02G 3/32 |
| 10,333,286 B2 | 6/2019 | Chen et al. | |
| 10,638,636 B1 * | 4/2020 | Chen | H01R 9/2416 |
| 2005/0258721 A1 | 11/2005 | Hung | |
| 2011/0290955 A1 * | 12/2011 | Yu | H05K 7/1491 |
| | | | 248/70 |
| 2015/0068992 A1 | 3/2015 | Chen et al. | |
| 2016/0198854 A1 * | 7/2016 | Barnes | A47B 88/44 |
| | | | 312/334.8 |
| 2016/0319582 A1 * | 11/2016 | Grabher | A47B 88/473 |
| 2020/0037462 A1 * | 1/2020 | Chen | H05K 7/1491 |

* cited by examiner

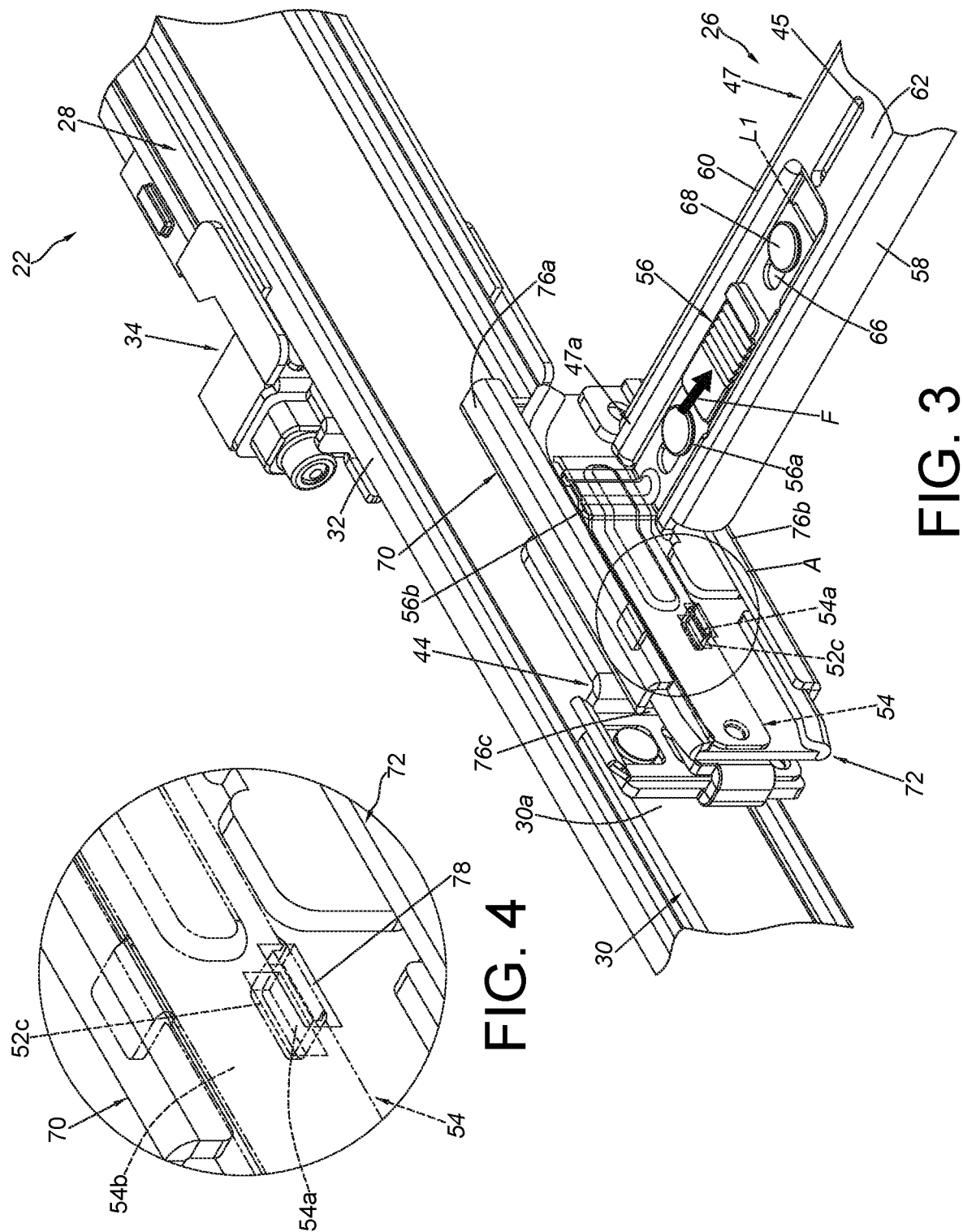

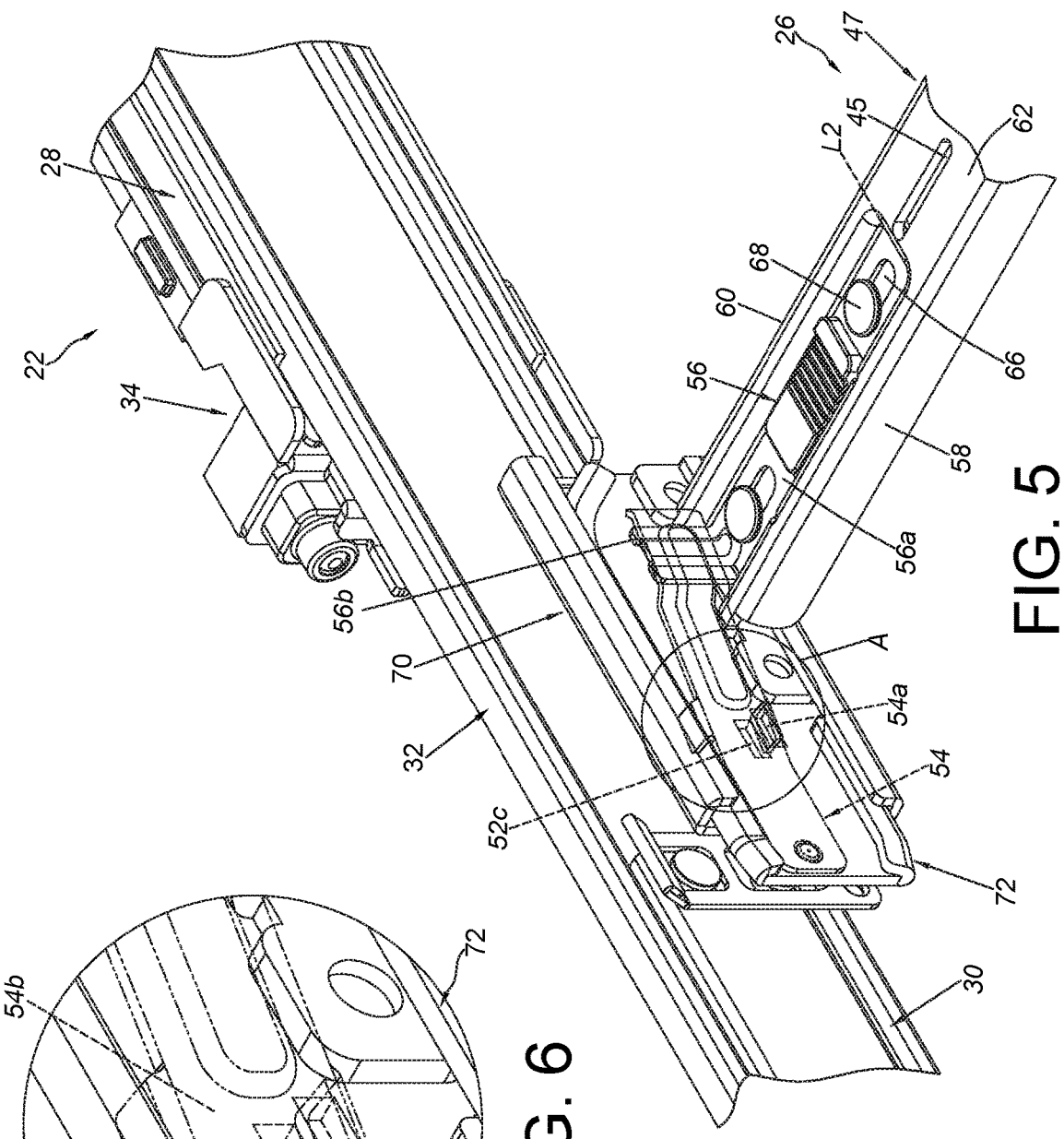

SLIDE RAIL MECHANISM AND SUPPORTING ASSEMBLY THEREOF

BACKGROUND OF THE INVENTION

1. Field of the Invention

The present invention relates to a slide rail mechanism, and more particularly, to a slide rail mechanism and a supporting assembly thereof.

2. Description of the Prior Art

Generally, in a rack system, a pair of slide rail assemblies mounted to a rack is usually configured to carry a carried object. The carried object can be an electronic device. Therefore, the rack system is also arranged with a cable management mechanism for supporting cables behind the electronic device.

U.S. Pat. No. 7,554,819 B2 discloses a pair of three-section slide rail assemblies. One of the slide rail assemblies is arranged with a cable management mechanism. The cable management mechanism has two cable management arms pivoted relative to each other. One of the cable management arms has one end connected to an outer rail (such as a fixed rail), and the other one of the cable management arms has one end connected to a movable rail (such as an inner rail). Furthermore, a support rail is configured to support a bottom part of the cable management mechanism. One of two ends of the support rail is connected to a middle rail of the slide rail assembly, such that the support rail can be moved along with the middle rail. (Please refer to FIG. 14 and FIG. 15. of the aforementioned prior art.)

U.S. Pat. No. 7,712,615 B2 discloses a pair of three-section slide rail assemblies. One of the slide rail assemblies is arranged with a cable management mechanism. The cable management mechanism has two cable management arms pivoted relative to each other. One of the cable management arms has one end connected to an outer rail (such as a fixed rail), and the other one of the cable management arms has one end connected to a movable rail (such as an inner rail). Furthermore, a support rail is configured to support a bottom part of the cable management mechanism. Two ends of the support rail are respectively movably mounted to passages of the outer rails (such as the fixed rails) of the pair of slide rail assemblies. When the two cable management arms are driven to expand in response to movement of a second rail (a middle rail), the support rail is driven to move accordingly. (Please refer to FIG. 3 of the aforementioned prior art.)

U.S. Pat. No. 7,472,795 B2 discloses a pair of slide rail assemblies. One of the slide rail assemblies is arranged with a cable management mechanism. The cable management mechanism has two cable management arms pivoted relative to each other. One of the cable management arms has one end connected to an outer rail (such as a fixed rail), and the other one of the cable management arms has one end connected to a movable rail (such as an inner rail). Furthermore, a support rail is configured to support a bottom part of the cable management mechanism. Two ends of the support rail are respectively movably mounted to passages of the outer rails (such as the fixed rails). (Please refer to FIG. 4 and FIG. 5 of the aforementioned prior art.)

In the three aforementioned prior arts, the support rail is not connected to the inner rail of the three-section slide rail assembly; or connecting mechanism between the support rail and the slide rail assembly may not meet a specific requirement of the market. Therefore, it is important to develop a different product.

SUMMARY OF THE INVENTION

The present invention provides a slide rail mechanism and a supporting assembly thereof.

According to an embodiment of the present invention, a slide rail mechanism comprises a first slide rail assembly, a second slide rail assembly and a supporting assembly. Each of the first and second slide rail assemblies comprises a first rail, a second rail and a third rail movably mounted between the first rail and the second rail. The second rail is longitudinally movable relative to the first rail. Wherein, the second rail of the first slide rail assembly and the second rail of the second slide rail assembly are respectively arranged with a first mounting device and a second mounting device. The supporting assembly comprises a supporting member, and a first connecting device and a second connecting device arranged on the supporting member. Wherein, the first connecting device and the second connecting device are detachably connected to the first mounting device and the second mounting device respectively.

Preferably, the supporting member is substantially transversally arranged relative to a longitudinal direction of each of the first and second slide rail assemblies, and the first connecting device and the second connecting device are respectively arranged adjacent to end parts of two portions of the supporting member.

Preferably, one of the first mounting device and the first connecting device comprises at least one engaging feature, and the other one of the first mounting device and the first connecting device comprises an engaging member configured to be engaged with the at least one engaging feature.

Preferably, the at least one engaging feature comprises a first engaging feature, a second engaging feature and a third engaging feature, and the engaging member comprises an engaging part configured to be selectively engaged with one of the first engaging feature, the second engaging feature and the third engaging feature.

Preferably, the first engaging feature, the second engaging feature and the third engaging feature are spaced from each other along a longitudinal direction of each of the first and second slide rail assemblies.

Preferably, the slide rail mechanism further comprises an operating member movably mounted to the supporting member. The engaging member has a flexible part arranged with the engaging part. When the operating member is operated to move from a first position to a second position, the operating member is configured to drive the flexible part of the engaging member to move in order to disengage the engaging part from one of the first engaging feature, the second engaging feature and the third engaging feature.

Preferably, the supporting member has a front part, a rear part and a middle part located between the front part and the rear part, and the operating member is arranged on the middle part.

Preferably, the front part and the rear part are substantially perpendicularly connected to the middle part.

Preferably, the middle part has a groove. One of the groove and the operating member is arranged with a guiding feature. At least one connecting member is configured to pass through a portion of the guiding feature to allow the operating member to be movable relative to the supporting member within a limited range.

Preferably, the slide rail mechanism further comprises a connecting base. The connecting base has a hole. The engaging member is attached to the connecting base. The engaging part of the engaging member is located at a position corresponding to the hole.

Preferably, the slide rail mechanism further comprises a mounting base. The mounting base comprises the at least one engaging feature. The connecting base is movably mounted to the mounting base through a guiding passage.

According to another embodiment of the present invention, a supporting assembly is applicable to a first mounting device. The supporting assembly comprises a supporting member and a first connecting device. The supporting member has a first portion and a second portion. The first connecting device is arranged adjacent to an end part of the first portion and configured to be engaged with the first mounting device.

Preferably, the supporting assembly further comprises a second connecting device arranged adjacent to an end part of the second portion. The second connecting device is configured to be engaged with a second mounting device.

Preferably, one of the first mounting device and the first connecting device comprises at least one engaging feature, and the other one of the first mounting device and the first connecting device comprises an engaging member configured to be engaged with the at least one engaging feature.

Preferably, the at least one engaging feature comprises two engaging features. The engaging member comprises an engaging part configured to be selectively engaged with one of the two engaging features.

Preferably, the two engaging features are spaced from each other along a longitudinal direction of the first mounting device.

Preferably, the supporting assembly further comprises an operating member movably mounted to the supporting member. The engaging member has a flexible part arranged with the engaging part. The flexible part is configured to provide an elastic force along a first predetermined direction to engage the engaging part with one of the two engaging features. When the operating member is operated to move from a first position to a second position along a second predetermined direction opposite to the first predetermined direction, the operating member is configured to drive the flexible part of the engaging member to move in order to disengage the engaging part from one of the two engaging features.

Preferably, the supporting member has a front part, a rear part and a middle part located between the front part and the rear part. The operating member is arranged on the middle part. The middle part has a groove. One of the groove and the operating member is arranged with a guiding feature. At least one connecting member is configured to pass through a portion of the guiding feature through to allow the operating member to be movable relative to the supporting member within a limited range.

Preferably, the supporting assembly further comprises a connecting base. The connecting base has a hole. The engaging member is attached to the connecting base. The engaging part of the engaging member is located at a position corresponding to the hole.

Preferably, the supporting assembly further comprises a mounting base. The mounting base comprises the at least one engaging feature. The connecting base is movably mounted to the mounting base through a guiding passage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a partial view showing the slide rail assembly and the supporting assembly being connected to each other through a mounting device and a connecting device according to an embodiment of the present invention;

FIG. 4 is an enlarged view of an area A of FIG. 3;

FIG. 5 is a partial view showing the slide rail assembly and the supporting assembly being disengaged from each other through the mounting device and the connecting device according to an embodiment of the present invention;

FIG. 6 is an enlarged view of an area A of FIG. 5;

DETAILED DESCRIPTION

Figure 1:
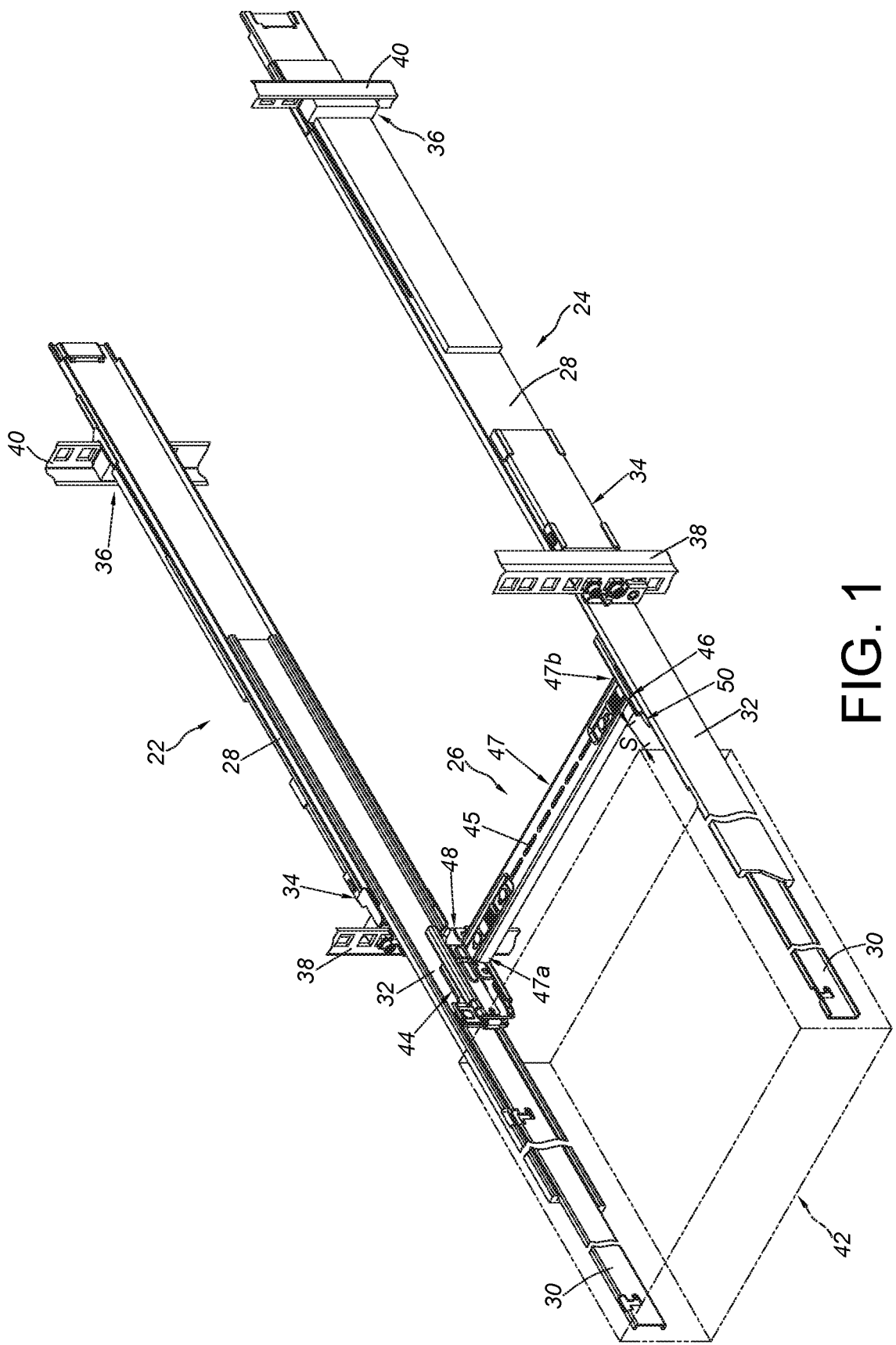
FIG. 1 is a diagram showing a slide rail mechanism configured to mount a carried object to a rack according to an embodiment of the present invention.

As shown in FIG. 1, a slide rail mechanism comprises a first slide rail assembly 22, a second slide rail assembly 24 and a supporting assembly 26 according to an embodiment of the present invention. Each of the first slide rail assembly 22 and the second slide rail assembly 24 comprises a first rail 28 and a second rail 30. Preferably, each of the first slide rail assembly 22 and the second slide rail assembly 24 further comprises a third rail 32 movably mounted between the first rail 28 and the second rail 30 for extending a traveling distance of the second rail 30 relative to the first rail 28. In the present embodiment, the first rail 28 is an outer rail (fixed rail), the second rail 30 is an inner rail, and the third rail 32 is a middle rail. A front part and a rear part of the first rail 28 are respectively mounted to a first post 38 and a second post 40 of a rack through a first bracket device 34 and a second bracket device 36. On the other hand, the second rail 30 is longitudinally movable relative to the first rail 28 through the third rail 32, and the second rail 30 is configured to mount a carried object 42. The carried object 42 can be an electronic apparatus or a chassis. Through moving the second rail 30 relative to the first rail 28 from a retracted state to an extended state, the carried object 42 can be pulled out of the rack.

The second rail 30 of the first slide rail assembly 22 and the second rail 30 of the second slide rail assembly 24 are respectively arranged with a first mounting device 44 and a second mounting device 46. Preferably, structural configuration of the first mounting device 44 is substantially identical (or symmetric) to structural configuration of the second mounting device 46.

The supporting assembly 26 comprises a supporting member 47, and a first connecting device 48 and a second connecting device 50 arranged on the supporting member 47. The first connecting device 48 and the second connecting device 50 are respectively connected (such as detachably connected) to the first mounting device 44 and the second mounting device 46. Preferably, the first mounting device 44 and the second mounting device 46 are respectively arranged adjacent to a rear end part of the second rail 30 of the first slide rail assembly 22 and a rear end part of the second rail 30 of the second slide rail assembly 24. Therefore, when the supporting member 47 is connected to the first mounting device 44 and the second mounting device 46 through the first connecting device 48 and the second connecting device 50, the supporting member 47 is located behind the carried object 42, and the supporting member 47 is separated from the carried object 42 by a predetermined distance. For example, the supporting member 47 is configured to support cables behind the carried object 42. Preferably, the supporting member 47 has at least one cable management feature 45 configured to manage the cables. In the present embodiment, the at least one cable management feature 45 can be a plurality of elongated holes. When the supporting member 47 supports the cables behind the carried object 42, a string or a strap (not shown in figures) can be used to pass through the at least one cable management feature 45 to bind or fix the cable; or an additional accommodating box (not shown in figures) can be used to engage with the at least one cable management feature 45 to accommodate or manage the cable. Preferably, structural configuration of the first connecting device 48 is substantially identical (or symmetric) to structural configuration of the second connecting device 50. Preferably, the supporting member 47 is substantially transversally arranged relative to a longitudinal direction of each of the first slide rail assembly 22 and the second slide rail assembly 24. The first connecting device 48 and the second connecting device 50 are respectively arranged adjacent to two opposite portions of the supporting member 47, such as a first portion 47a and a second portion 47b. Specifically, the first connecting device 48 is arranged adjacent to an end part of the first portion 47a of the supporting member 47, and the second connecting device 50 is arranged adjacent to an end part of the second portion 47b of the supporting member 47.

Figure 2:
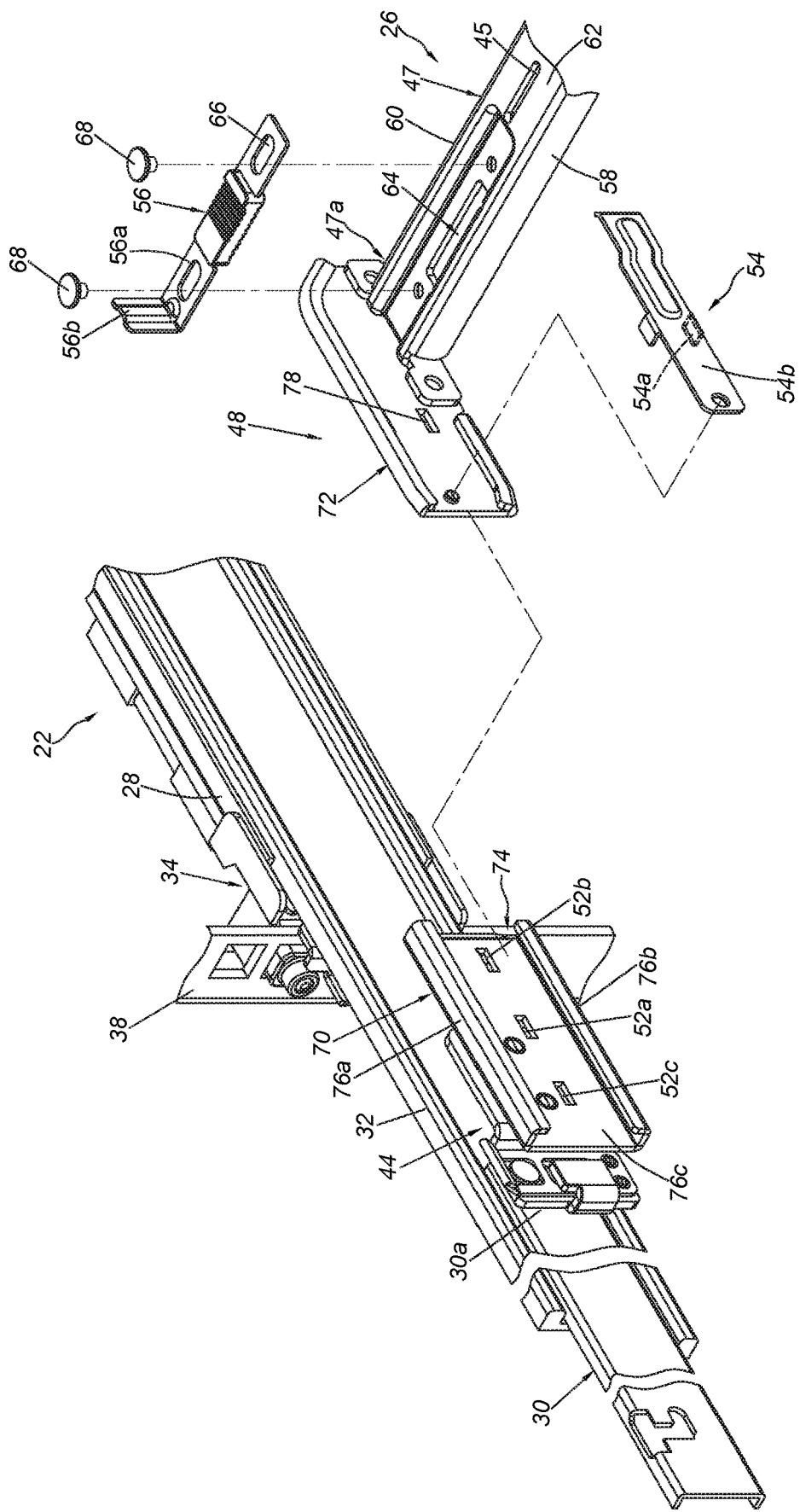
FIG. 2 is a partial exploded view of a slide rail assembly and a supporting assembly according to an embodiment of the present invention.

As shown in FIG. 2 and FIG. 3, the second rail 30 is in the extended state relative to the first rail 28. The first mounting device 44 is arranged adjacent to an end part (such as a rear end part 30a) of the second rail 30 of the first slide rail assembly 22.

One of the first mounting device 44 and the first connecting device 48 comprises at least one engaging feature. In the present embodiment, the first mounting device 44 comprises a first engaging feature 52a, a second engaging feature 52b and a third engaging feature 52c, but the present invention is not limited thereto. Preferably, the first engaging feature 52a, the second engaging feature 52b and the third engaging feature 52c are spaced from each other along the longitudinal direction of each of the first slide rail assembly 22 and the second slide rail assembly 24. In the present embodiment, the engaging features 52a, 52b, 52c are engaging holes. On the other hand, the other one of the first mounting device 44 and the first connecting device 48 comprises an engaging member 54. The engaging member 54 is configured to be selectively engaged with one of the first engaging feature 52a, the second engaging feature 52b and the third engaging feature 52c. In the present embodiment, the first connecting device 48 comprises the engaging member 54.

Preferably, the engaging member 54 comprises an engaging part 54a and a flexible part 54b. The flexible part 54b is arranged with the engaging part 54a. The flexible part 54b is configured to provide an elastic force along a first predetermined direction to drive the engaging part 54a to selectively engage with one of the first engaging feature 52a, the second engaging feature 52b and the third engaging feature 52c. For example, the engaging part 54a is engaged with the third engaging feature 52c (please refer to FIG. 3).

Preferably, the slide rail mechanism further comprises an operating member 56 movably mounted to the supporting member 47. Preferably, the operating member 56 has a main body part 56a and a driving part 56b bent relative to the main body part 56a. In the present embodiment, the driving part 56b is substantially perpendicularly connected to the main body part 56a, but the present invention is not limited thereto.

Preferably, the supporting member 47 has a front part 58, a rear part 60 and a middle part 62 located between the front part 58 and the rear part 60, and the operating member 56 is arranged on the middle part 62. The front part 58 and the rear part 60 are substantially perpendicularly connected to the middle part 62. The middle part 62 has a groove 64 configured to accommodate the operating member 56. One of the groove 64 and the operating member 56 is arranged with a guiding feature 66 (such as an elongated hole or an elongated slot). The guiding feature 66 is arranged in a direction substantially identical to a longitudinal direction of the supporting member 47. At least one connecting member 68 is configured to pass through a portion of the guiding feature 66 to allow the operating member 56 to be movable relative to the supporting member 47 within a limited range.

Preferably, the supporting assembly 26 further comprises a mounting base 70 and a connecting base 72. The mounting base 70 comprises the at least one engaging feature (such as the engaging features 52a, 52b, 52c). The connecting base 72 is movably mounted to the mounting base 70 through a guiding passage 74. For example, one of the mounting base 70 and the connecting base 72 comprises a first bending wall 76a, a second bending wall 76b and a side wall 76c connected between the first bending wall 76a and the second bending wall 76b. In the present embodiment, the mounting base 70 comprises the first bending wall 76a, the second bending wall 76b and the side wall 76c. The guiding passage 74 is defined by the first bending wall 76a, the second bending wall 76b and the side wall 76c for accommodating the connecting base 72.

Preferably, the side wall 76c of the mounting base 70 is arranged with the at least one engaging feature (such as the first engaging feature 52a, the second engaging feature 52b and the third engaging feature 52c). On the other hand, the connecting base 72 has a hole 78. The engaging member 54 is attached to the connecting base 72, and the engaging part 54a of the engaging member 54 is located at a position corresponding to the hole 78 to be engaged with the at least one engaging feature of the mounting base 70, such as the first engaging feature 52a, the second engaging feature 52b or the third engaging feature 52c (please refer to FIG. 4, the engaging part 54a of the engaging member 54 is configured to be engaged with the third engaging feature 52c of the mounting base 70).

As shown in FIG. 3 to FIG. 6, when a force F is applied to the operating member 56 along a second predetermined direction opposite to the first predetermined direction to move the operating member 56 from a first position L1 (as shown in FIG. 3) to a second position L2 (as shown in FIG. 5), the operating member 56 is configured to drive the flexible part 54b of the engaging member 54 to disengage the engaging part 54a from one of the first engaging feature 52a, the second engaging feature 52b and the third engaging feature 52c.

For example, when a user apply the force F to the main body part 56a of the operating member 56 to move the operating member 56 from the first position L1 (as shown in FIG. 3) to the second position L2 (as shown in FIG. 5), the driving part 56b of the operating member 56 is configured to drive the flexible part 54b of the engaging member 54 to move and generate an elastic force, such that the engaging part 54a is disengaged from the at least one engaging feature, such as the first engaging feature 52a, the second engaging feature 52b or the third engaging feature 52c (please refer to FIG. 6, the engaging part 54a of the engaging member 54 is disengaged from the third engaging feature 52c of the mounting base 70). On the other hand, when the force F no longer exists, the elastic force of the flexible part 54b of the engaging member 54 is released to drive the operating member 56 to return to an initial state (i.e. a state shown in FIG. 3).

Figure 7:
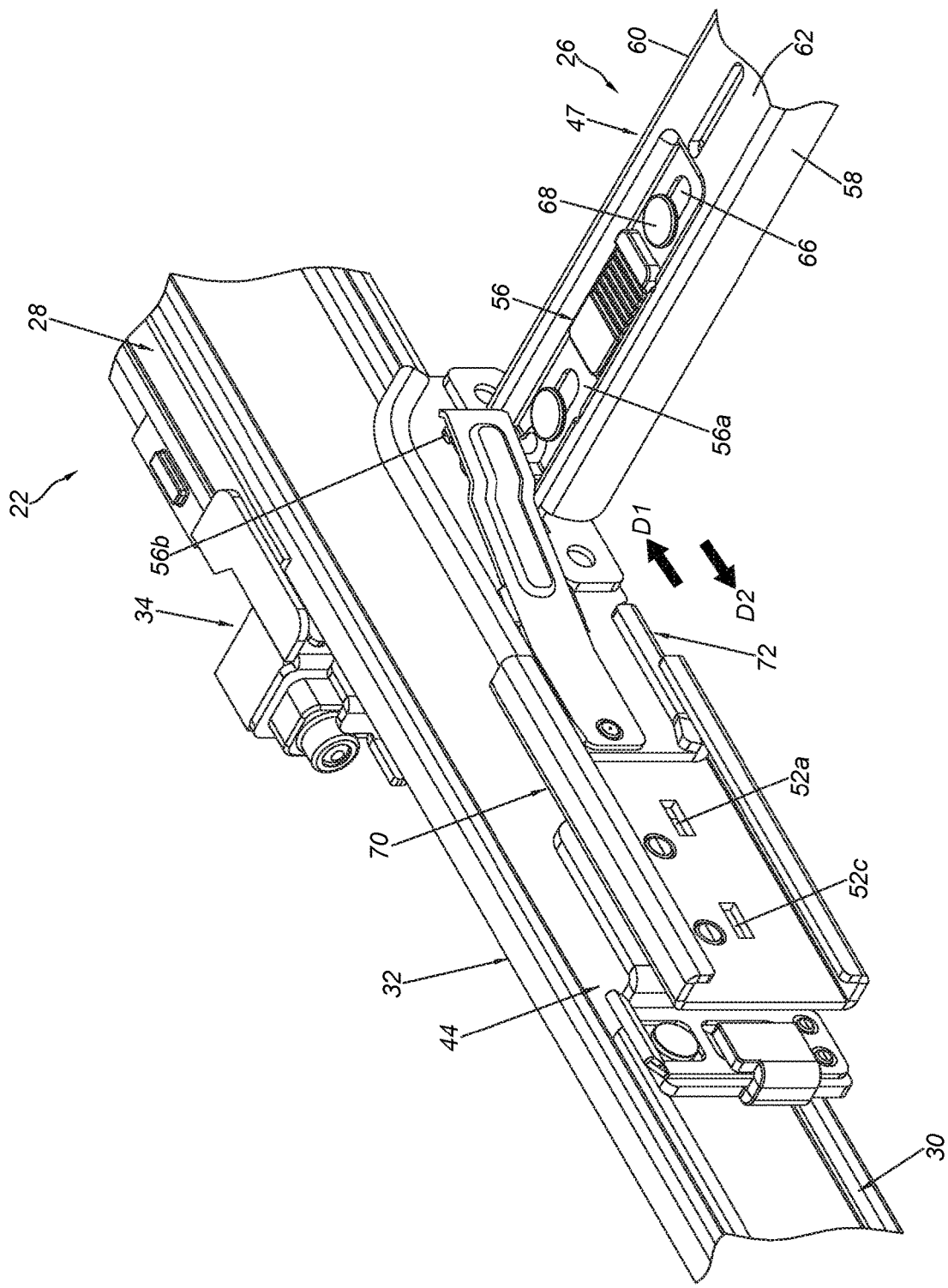
FIG. 7 is a partial view showing the supporting assembly adjustable relative to the mounting device along two directions when the slide rail assembly and the supporting assembly are disengaged from each other through the connecting device and the mounting device according to an embodiment of the present invention.

As shown in FIG. 7, when the engaging part 54a of the engaging member 54 of the first connecting device 48 (and the second connecting device 50) of the supporting assembly 26 is disengaged from the at least one engaging feature (such as the first engaging feature 52a, the second engaging feature 52b or the third engaging feature 52c) of the first mounting device 44 (and the second mounting device 46), the supporting assembly 26 is longitudinally movable relative to the first mounting device 44 (and the second mounting device 46) along a first direction D1 or a second direction D2; or the supporting assembly 26 can be detached from the first mounting device 44 (and the second mounting device 46) along the first direction D1. The second direction D2 is opposite to the first direction D1.

Figure 8:
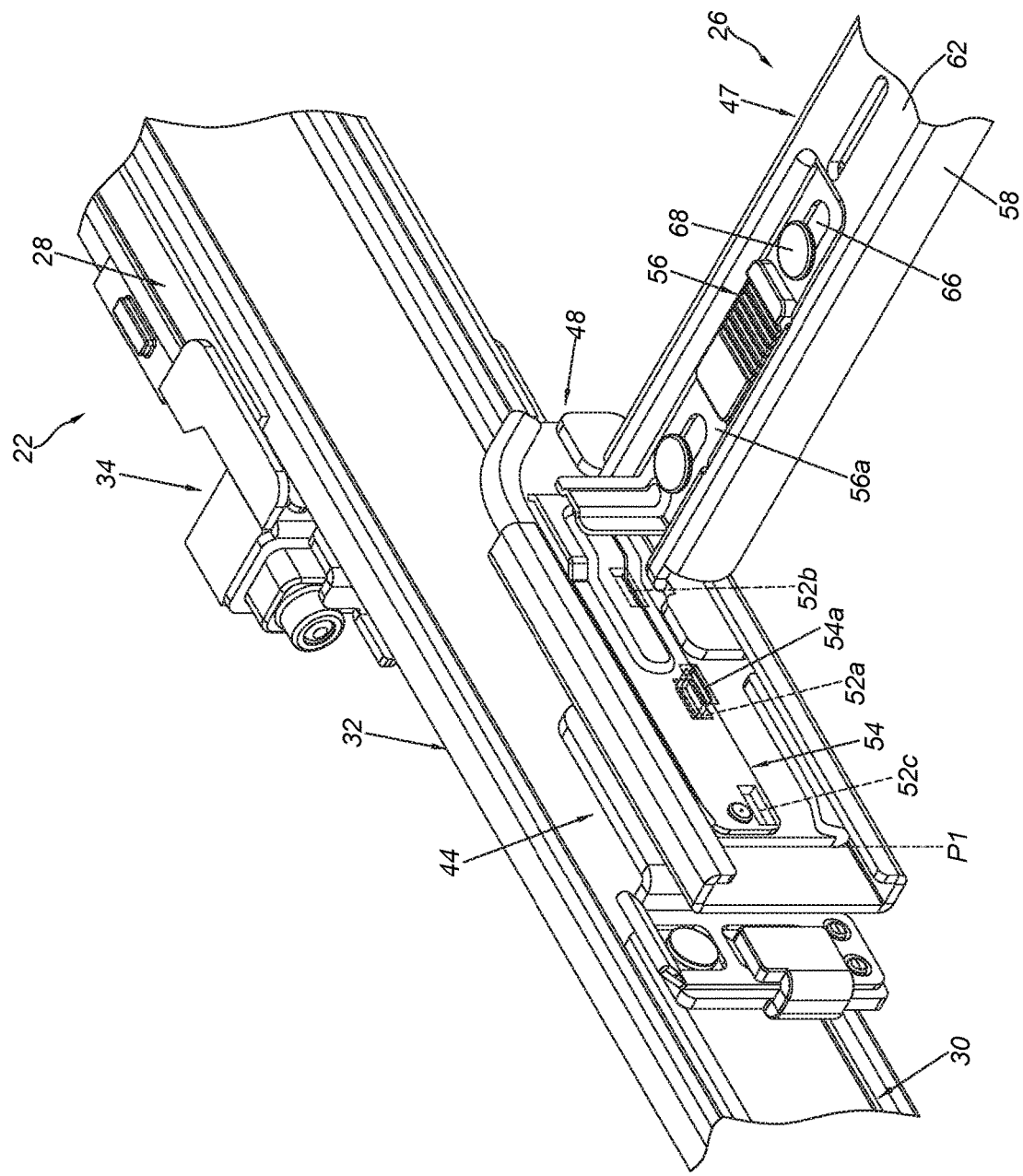
FIG. 8 is a partial view showing the supporting assembly configured to be located at a first connecting position relative to the slide rail assembly through the connecting device being engaged with the mounting device according to an embodiment of the present invention.
Figure 9:
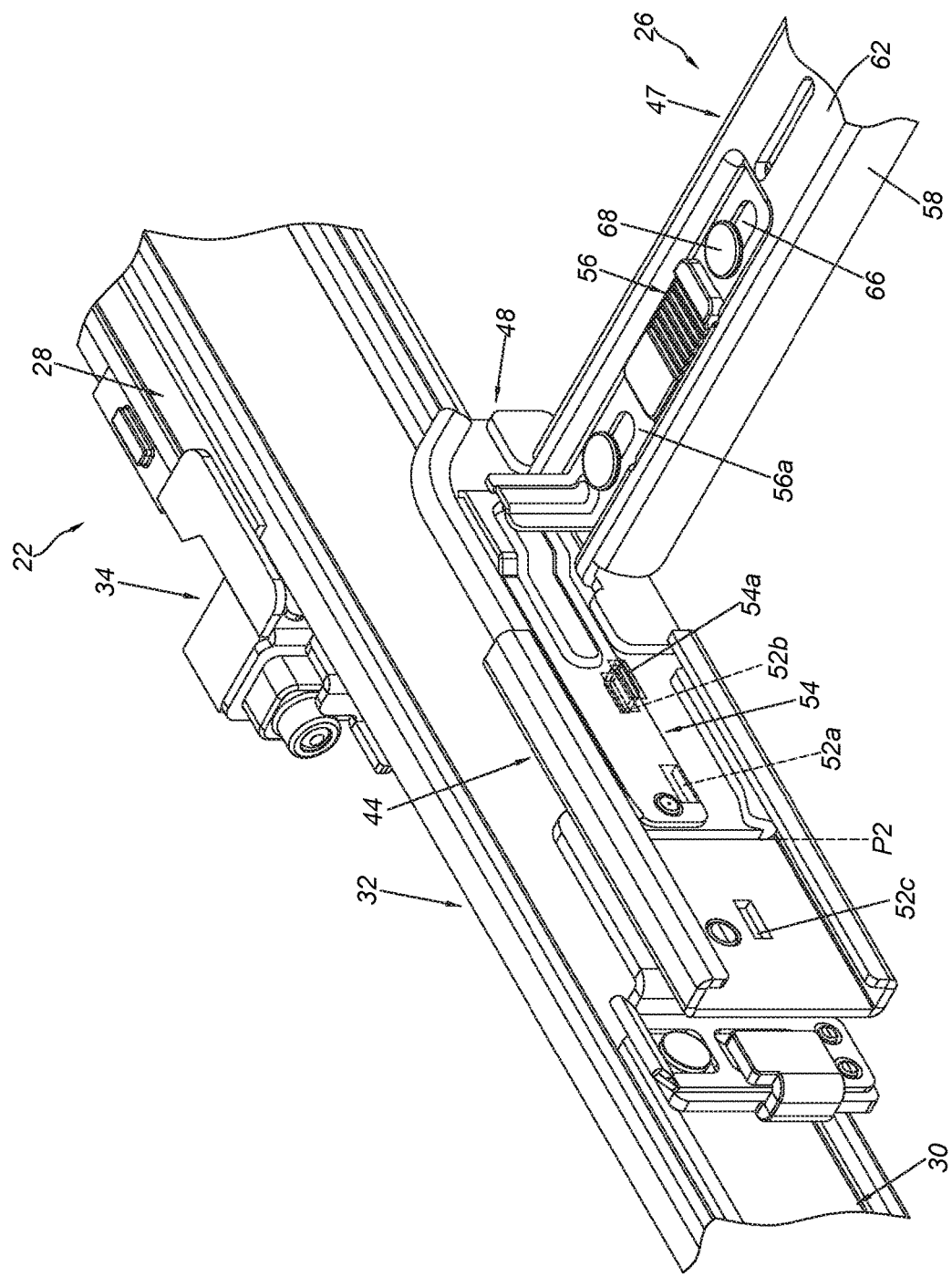
FIG. 9 is a partial view showing the supporting assembly configured to be located at a second connecting position relative to the slide rail assembly through the connecting device being engaged with the mounting device according to an embodiment of the present invention.
Figure 10:
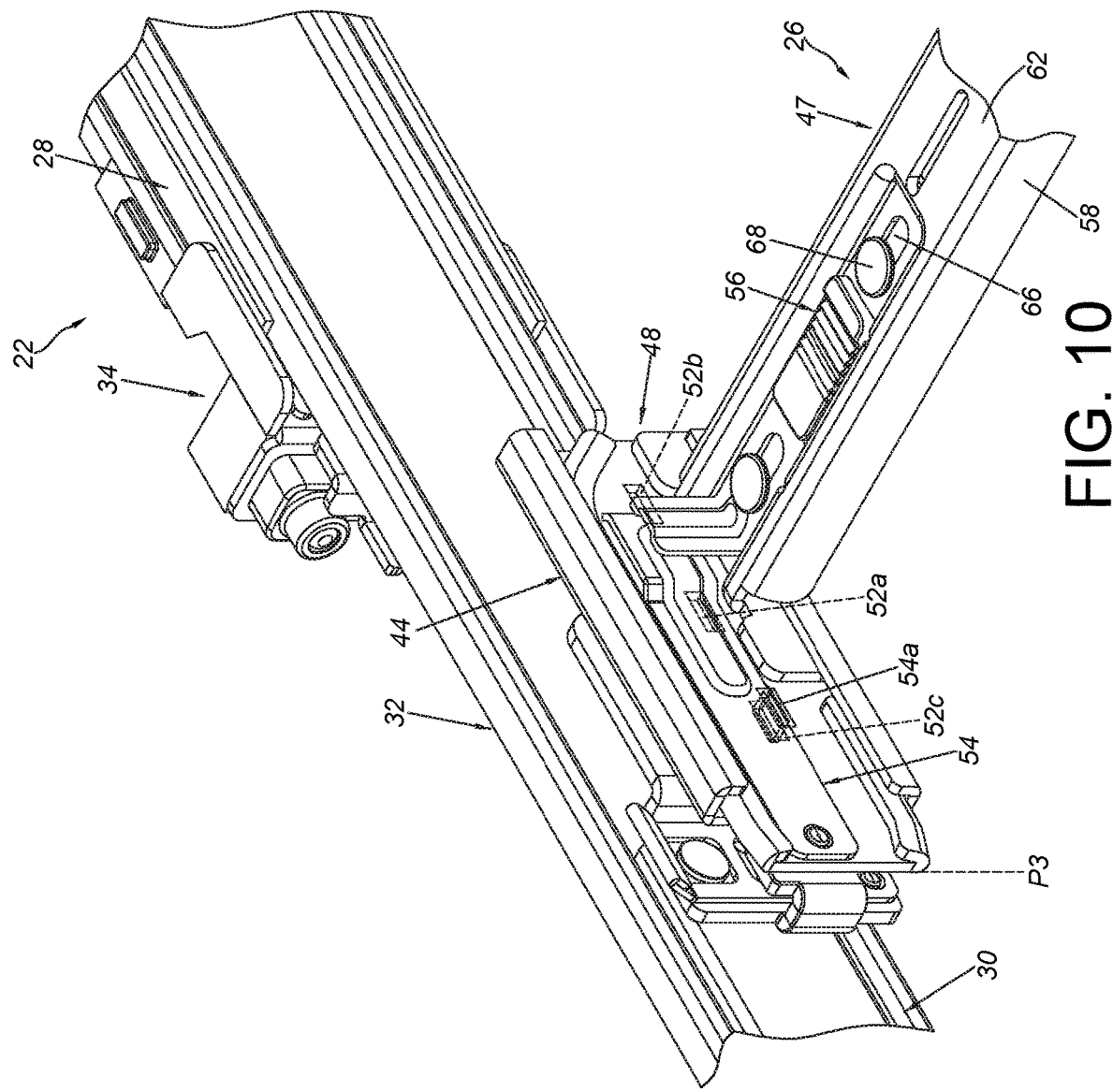
FIG. 10 is a partial view showing the supporting assembly configured to be located at a third connecting position relative to the slide rail assembly through the connecting device being engaged with the mounting device according to an embodiment of the present invention.

As shown in FIG. 8, FIG. 9 and FIG. 10, the supporting assembly 26 can be adjusted to longitudinally move relative to the first mounting device 44 (and the second mounting device 46) to a first connecting position P1 (as shown in FIG. 8), a second connecting position P2 (as shown in FIG. 9), or a third connecting position P3 (as shown in FIG. 10).

Specifically, the supporting assembly 26 can be fixed at the first connecting position P1 (as shown in FIG. 8) through the engaging part 54a of the engaging member 54 being engaged with the first engaging feature 52a; or the supporting assembly 26 can be fixed at the second connecting position P2 (as shown in FIG. 9) through the engaging part 54a of the engaging member 54 being engaged with the second engaging feature 52b; or the supporting assembly 26 can be fixed at the third connecting position P3 (as shown in FIG. 10) through the engaging part 54a of the engaging member 54 being engaged with the third engaging feature 52c.

Figure 11:
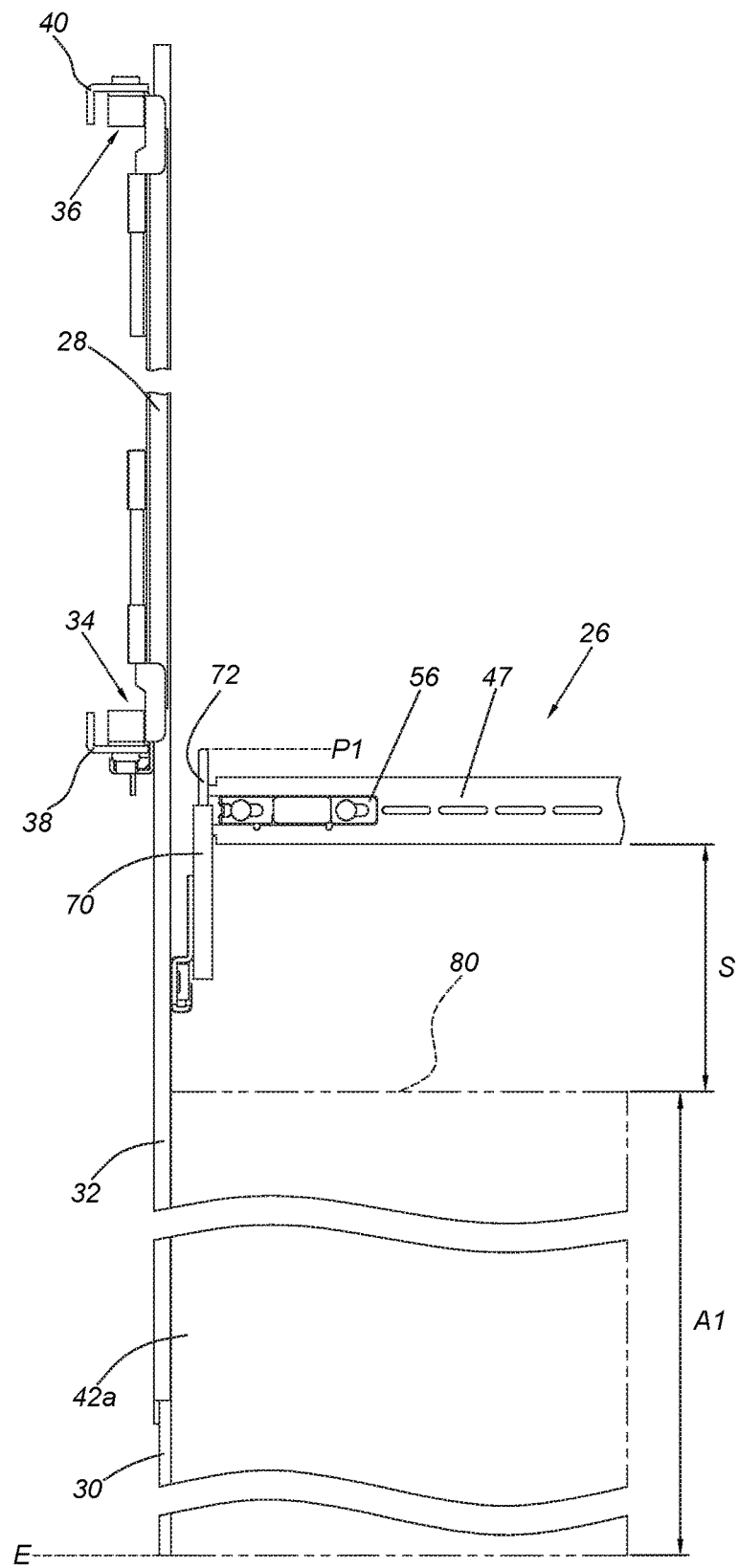
FIG. 11 is a diagram showing the supporting assembly configured to be located at the first connecting position relative to the slide rail assembly through the connecting device being engaged with the mounting device in order to separate the supporting assembly from the carried object by a predetermined distance according to an embodiment of the present invention.

As shown in FIG. 11, the first rail 28, the second rail 30 and the third rail 32 of each of the two slide rail assemblies 22, 24 are in the extended state E (only the first slide rail assembly 22 is shown in FIG. 11). Specifically, the second rail 30 is configured to carry a first carried object 42a, and the first carried object 42a has a first longitudinal length A1. Since an electronic module is usually arranged on a rear portion 80 of the first carried object 42a, the supporting member 47 of the supporting assembly 26 is configured to keep the predetermined distance S from the rear portion 80 of the first carried object 42a, so as to assist the user in inserting or removing a connector of a cable of the electronic module. For the first carried object 42a having the first longitudinal length A1, the supporting assembly 26 can be adjusted to longitudinally move to the first connecting position P1 to keep the predetermined distance S between the supporting member 47 and the rear portion 80 of the first carried object 42a.

Figure 12:
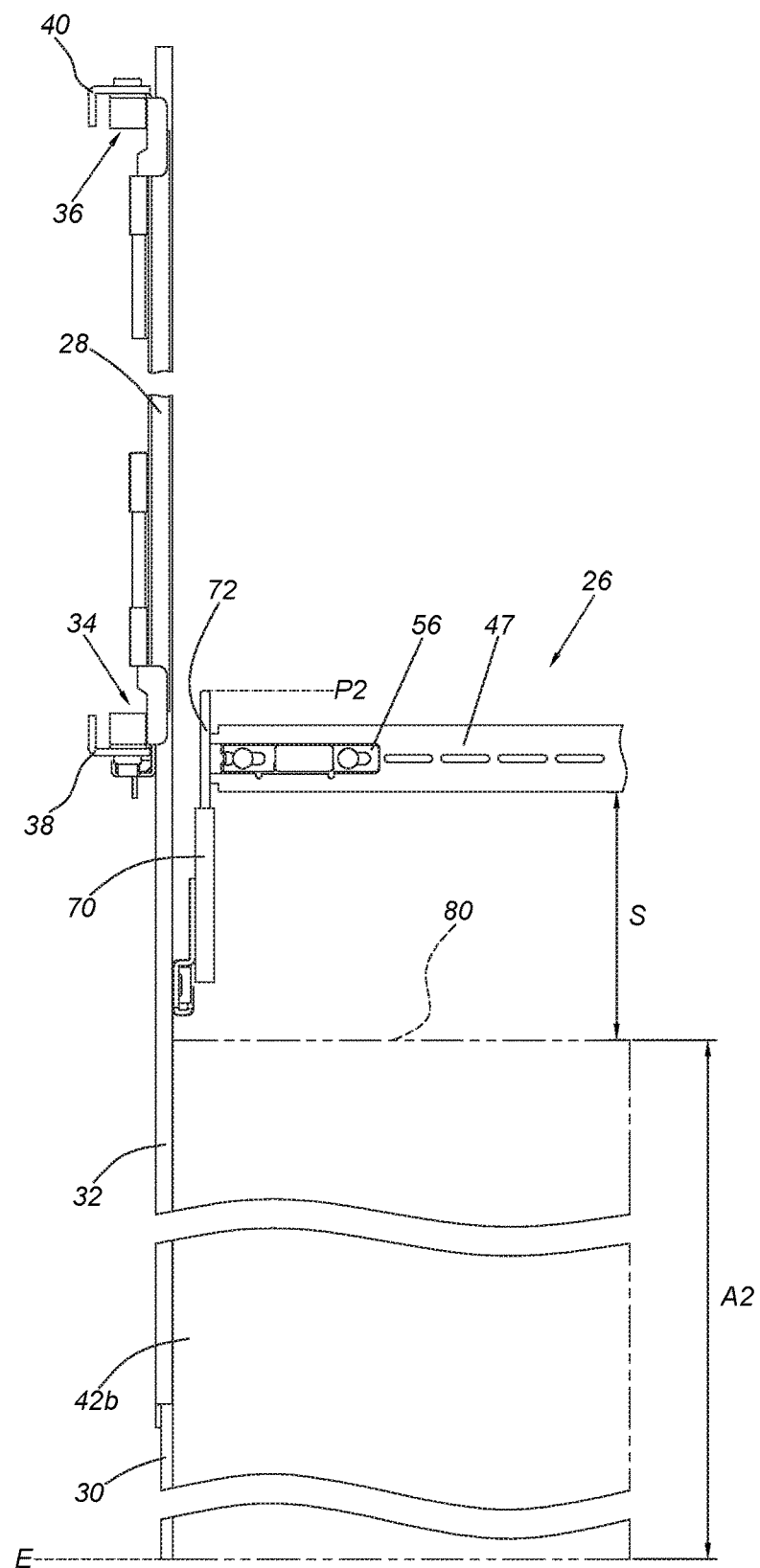
FIG. 12 is a diagram showing the supporting assembly configured to be located at the second connecting position relative to the slide rail assembly through the connecting device being engaged with the mounting device in order to separate the supporting assembly from the carried object by the predetermined distance according to an embodiment of the present invention.

As shown in FIG. 12, for a second carried object 42b having a second longitudinal length A2, the supporting assembly 26 can be adjusted to longitudinally move to the second connecting position P2 to keep the predetermined distance S between the supporting member 47 and a rear portion 80 of the second carried object 42b.

Figure 13:
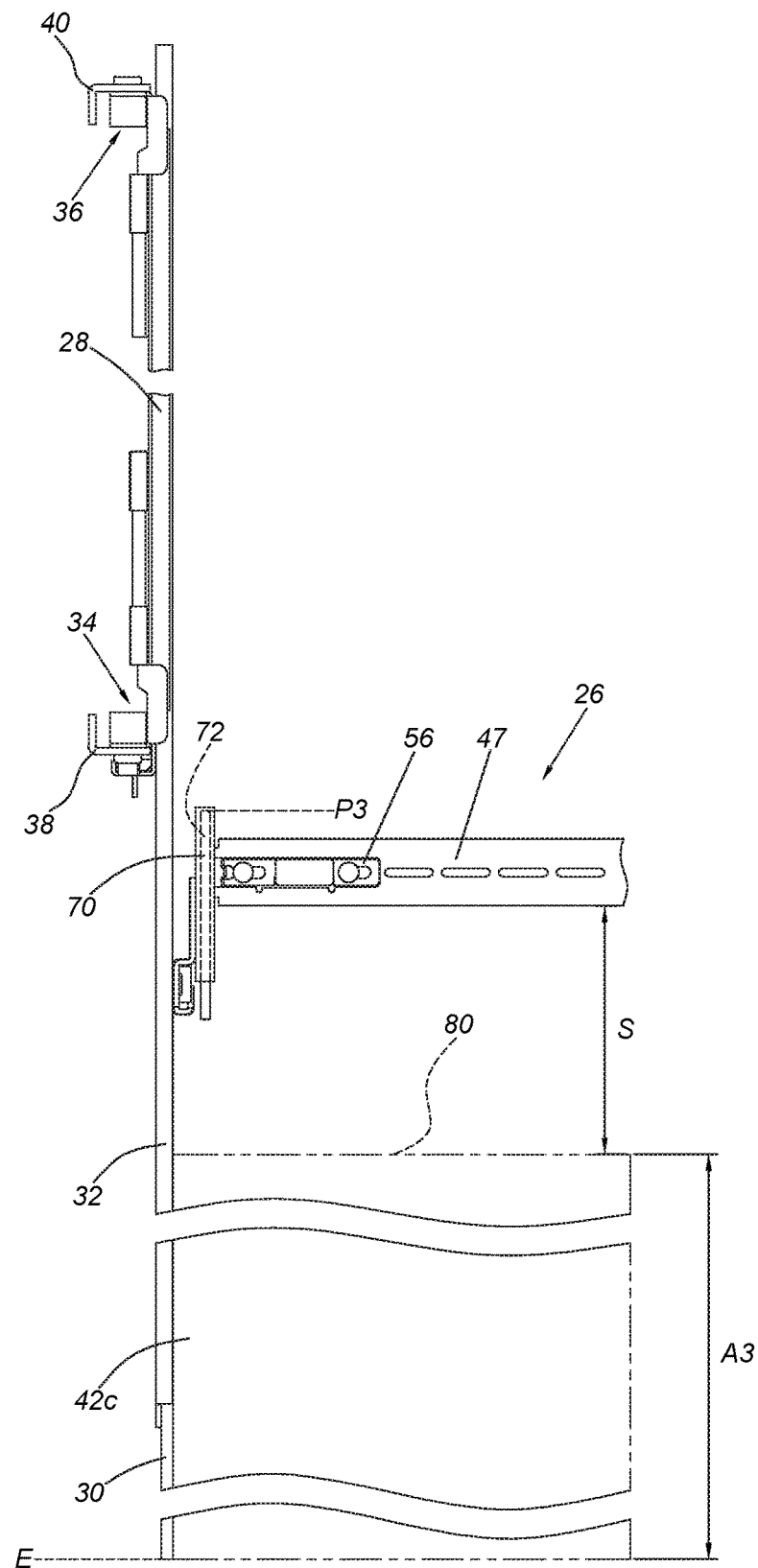
FIG. 13 is a diagram showing the supporting assembly configured to be located at the third connecting position relative to the slide rail assembly through the connecting device being engaged with the mounting device in order to separate the supporting assembly from the carried object by the predetermined distance according to an embodiment of the present invention.

As shown in FIG. 13, for a third carried object 42c having a third longitudinal length A3, the supporting assembly 26 can be adjusted to longitudinally move to the third connecting position P3 to keep the predetermined distance S between the supporting member 47 and a rear portion 80 of the third carried object 42c.

The supporting assembly 26 (or the supporting member 47 of the supporting assembly 26) can be adjusted to different positions in response to the carried objects with different longitudinal lengths. In other embodiments, the supporting assembly 26 (or the supporting member 47 of the supporting assembly 26) can be adjusted to different positions for adjusting a distance between the rear portion 80 of the carried object 42 and the supporting assembly 26.

Therefore, the slide rail mechanism and the supporting assembly of the present invention are characterized in that:

1. The supporting assembly 26 can be connected (such as detachably connected) to the second rail 30 (such as the inner rail) of the slide rail assembly.

2. The supporting assembly 26 can be longitudinally adjusted relative to the mounting devices 44, 46 to different connecting positions P1, P2, P3.

3. When the force F is applied to the operating member 56 along the second predetermined direction opposite to the first predetermined direction to move the operating member 56 from the first position L1 (as shown in FIG. 3) to the second position L2 (as shown in FIG. 5), the operating member 56 is configured to drive the flexible part 54b of the engaging member 54 to disengage the engaging part 54a from one of the first engaging feature 52a, the second engaging feature 52b and the third engaging feature 52c. Since the second predetermined direction is opposite to the first predetermined direction, the user can reliably disengage the engaging member 54 from the engaging feature through operating the operating member 56.

4. The operating member 56 is arranged in the groove 64 of the supporting member 47 to save space. In addition, when the supporting member 47 supports the cables, the operating member 56 accommodated in the groove 64 can be prevented from interfering with the cables.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism, comprising:
   a first slide rail assembly and a second slide rail assembly, each of the first and second slide rail assemblies comprising a first rail, a second rail and a third rail, and the second rail being longitudinally movable relative to the first rail, wherein the first rail is an outer rail configured to be fixedly mounted to a rack, the second rail is an inner rail configured to mount a carried object, and the third rail is a middle rail movably mounted between the first rail and the second rail; wherein the second rail of the first slide rail assembly and the second rail of the second slide rail assembly are respectively fixedly arranged with a first mounting device and a second mounting device; and
   a supporting assembly comprising a supporting member, and a first connecting device and a second connecting device arranged on the supporting member, wherein the first connecting device and the second connecting device are detachably connected to the first mounting device and the second mounting device respectively,
   wherein the supporting member is configured to be synchronously moved with the second rails of the first and second slide rail assemblies when the first connecting device and the second connecting device are connected to the first mounting device and the second mounting device respectively.

2. The slide rail mechanism of claim 1, wherein the supporting member is substantially transversally arranged relative to a longitudinal direction of each of the first and second slide rail assemblies, and the first connecting device and the second connecting device are respectively arranged adjacent to end parts of two portions of the supporting member.

3. The slide rail mechanism of claim 1, wherein one of the first mounting device and the first connecting device comprises at least one engaging feature, and the other one of the first mounting device and the first connecting device comprises an engaging member configured to be engaged with the at least one engaging feature.

4. The slide rail mechanism of claim 3, wherein the at least one engaging feature comprises a first engaging feature, a second engaging feature and a third engaging feature, and the engaging member comprises an engaging part configured to be selectively engaged with one of the first engaging feature, the second engaging feature and the third engaging feature.

5. The slide rail mechanism of claim 4, wherein the first engaging feature, the second engaging feature and the third engaging feature are spaced from each other along a longitudinal direction of each of the first and second slide rail assemblies.

6. The slide rail mechanism of claim 4, further comprising an operating member movably mounted to the supporting member, wherein the engaging member has a flexible part arranged with the engaging part; wherein when the operating member is operated to move from a first position to a second position, the operating member is configured to drive the flexible part of the engaging member to move in order to disengage the engaging part from one of the first engaging feature, the second engaging feature and the third engaging feature.

7. The slide rail mechanism of claim 6, wherein the supporting member has a front part, a rear part and a middle part located between the front part and the rear part, and the operating member is arranged on the middle part.

8. The slide rail mechanism of claim 7, wherein the front part and the rear part are substantially perpendicularly connected to the middle part.

9. The slide rail mechanism of claim 7, wherein the middle part has a groove, one of the groove and the operating member is arranged with a guiding feature, and at least one connecting member is configured to pass through a portion of the guiding feature to allow the operating member to be movable relative to the supporting member within a limited range.

10. The slide rail mechanism of claim 7, further comprising a connecting base, wherein the connecting base has a hole, the engaging member is attached to the connecting base, and the engaging part of the engaging member is located at a position corresponding to the hole.

11. The slide rail mechanism of claim 10, further comprising a mounting base, wherein the mounting base comprises the at least one engaging feature, and the connecting base is movably mounted to the mounting base through a guiding passage.

12. A supporting system, comprising:
    a first mounting device configured to be fixedly mounted to an inner rail of a first slide rail assembly, wherein an outer rail of the first slide rail assembly is configured to be fixedly mounted to a rack, and a middle rail of the first slide rail assembly is movably mounted between the outer rail and the inner rail of the first slide rail assembly;
    a second mounting device configured to be fixedly mounted to an inner rail of a second slide rail assembly, wherein an outer rail of the second slide rail assembly is configured to be fixedly mounted to the rack, and a middle rail of the second slide rail assembly is movably mounted between the outer rail and the inner rail of the second slide rail assembly;
    a supporting member having a first portion and a second portion;
    a first connecting device arranged adjacent to an end part of the first portion and configured to be detachably engaged with the first mounting device; and
    a second connecting device arranged adjacent to an end part of the second portion and configured to be detachably engaged with the second mounting device,
    wherein the supporting member is configured to be synchronously moved with the inner rails of the first and second slide rail assemblies when the first connecting device and the second connecting device are engaged with the first mounting device and the second mounting device respectively.

13. The supporting system of claim 12, wherein one of the first mounting device and the first connecting device comprises at least one engaging feature, and the other one of the first mounting device and the first connecting device comprises an engaging member configured to be engaged with the at least one engaging feature.

14. The supporting system of claim 13, wherein the at least one engaging feature comprises two engaging features, and the engaging member comprises an engaging part configured to be selectively engaged with one of the two engaging features.

15. The supporting system of claim 14, wherein the two engaging features are spaced from each other along a longitudinal direction of the first mounting device.

16. The supporting system of claim 14, further comprising an operating member movably mounted to the supporting member, wherein the engaging member has a flexible part arranged with the engaging part, wherein the flexible part is configured to provide an elastic force along a first predetermined direction to engage the engaging part with one of the two engaging features; wherein when the operating member is operated to move from a first position to a second position along a second predetermined direction opposite to the first predetermined direction, the operating member is configured to drive the flexible part of the engaging member to move in order to disengage the engaging part from one of the two engaging features.

17. The supporting system of claim 16, wherein the supporting member has a front part, a rear part and a middle part located between the front part and the rear part, the operating member is arranged on the middle part, the middle part has a groove, one of the groove and the operating member is arranged with a guiding feature, and at least one connecting member is configured to pass through a portion of the guiding feature through to allow the operating member to be movable relative to the supporting member within a limited range.

18. The supporting system of claim 16, further comprising a connecting base, wherein the connecting base has a hole, the engaging member is attached to the connecting base, and the engaging part of the engaging member is located at a position corresponding to the hole.

19. The supporting system of claim 18, further comprising a mounting base, wherein the mounting base comprises the at least one engaging feature, and the connecting base is movably mounted to the mounting base through a guiding passage.

\* \* \* \* \*